United States Patent
Miura

(10) Patent No.: US 6,559,041 B2
(45) Date of Patent: May 6, 2003

(54) SEMICONDUCTOR DEVICE AND METHOD FOR MANUFACTURING SAME

(75) Inventor: Yoshinao Miura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/090,554

(22) Filed: Mar. 4, 2002

(65) Prior Publication Data

US 2002/0098692 A1 Jul. 25, 2002

Related U.S. Application Data

(62) Division of application No. 09/329,646, filed on Jun. 9, 1999, now abandoned.

(30) Foreign Application Priority Data

Jun. 10, 1998 (JP) .......................................... 10-161643

(51) Int. Cl.$^7$ .......................................... H01L 21/3205

(52) U.S. Cl. ........................ 438/586; 438/660; 438/683; 438/762; 438/768

(58) Field of Search .................................. 438/300, 299, 438/584, 683, 586, 682, 592, 597; 257/382, 384, 757

(56) References Cited

U.S. PATENT DOCUMENTS

| | | | |
|---|---|---|---|
| 5,075,243 A | * | 12/1991 | Nieh et al. |
| 6,008,111 A | * | 12/1999 | Fushida et al. ............. 438/584 |
| 6,168,961 B1 | * | 1/2001 | Vaccari ........................ 438/16 |
| 2002/0061639 A1 | * | 5/2002 | Itonaga ....................... 438/592 |

* cited by examiner

*Primary Examiner*—Olik Chaudhuri
*Assistant Examiner*—Khiem Nguyen
(74) *Attorney, Agent, or Firm*—Hayes Soloway P.C.

(57) ABSTRACT

In a semiconductor device that uses a low-resistance ohmic contact and which is suitable for high-speed operation, the ohmic contacts are formed by a single-crystal $CoSi_2$ film that is formed on the (100) surface of a silicon substrate.

11 Claims, 3 Drawing Sheets

(a)

(b)

(c)

(a)

(b)

(c)

SEMICONDUCTOR DEVICE AND METHOD FOR MANUFACTURING SAME

CROSS-REFERENCE TO RELATED APPLICATION

This application is a divisional of U.S. application Ser. No. 09/329,646, filed Jun. 9, 1999, now abandoned.

BACKGROUND OF THE INVENTION

1. Field of the Invention

The present invention relates to a semiconductor device and a method for manufacturing a semiconductor device, and more specifically it relates to a semiconductor device which has a low-resistance ohmic contact that is suitable for use in high-speed device operation, and which enables the achievement and maintenance of a high-quality barrier property and high immunity to leakage current at this ohmic contact part, and to a method of manufacturing such a semiconductor device.

2. Description of the Related Art

In recent years, with ever-increasing levels of integration in semiconductor devices, there is an increasing tendency toward the short channel effect, that is, a decrease in the gate threshold voltage value, caused by the intrusion of a doped diffusion layer, which is used to separate various source and drain regions, below the gate and, to suppress this phenomenon, there is an increased need to make the junction depth of the ohmic contact part that is formed on the source and drain regions thin.

Therefore, an inevitable problem to be overcome is that of forming a contact boundary surface that is even sharper and more uniform than in the past. Metals such as titanium, cobalt, and nickel, which form suicides are coming into use for the purpose of forming self-aligning contacts.

A solid-phase siliciding reaction, however, is usually non-uniform, resulting in circular metal crystals and disturbance to the crystal structure of the diffusion layer, this leading to the tendency for leakage currents to occur.

Additionally, the silicide itself reacts easily with aluminum, the main metal that is used to form the contact wire, and particularly in the case of a non-uniform silicide film having many grain boundaries, a barrier film is necessary in order to be able to tolerate manufacturing processes at temperatures above 600° C.

It is difficult to achieve a uniform epitaxial suicide film on a silicon (100) substrate that i[] usually used for semiconductor devices. For the case of the cobalt silicide contact of the past, as taught in the Japanese Unexamined Patent Publication (KOKAI No. 3-67334, Japanese Unexamined Patent Publication (KOKAT) No. 9-69497, Japanese Unexamined Patent Publication (KOKAI) No. 9-251967, and Japanese Unexamined Patent Publication (KOKAI) No. 10-45416, there is disclosure of forming a film (100 to 150 $\mu\Omega$-cm) from the crystal phase of high-resistance CoSi or the like, by means of a first heat treating (at around 450° C.), after which heat treating at 600° C. or higher is done to form a film (14 to 17 $\mu\Omega$-cm) from low-resistance crystal phase $CoSi_2$.

However, in a method which passes through a silicide crystal phase such as that of CoSi, which has a small amount of Si, the film formed is a $CoSi_2$ (100) film, thereby making it difficult to achieve a uniform epitaxial film.

One reason for siliciding proceeding non-uniformly is existence of various silicides that have different compositions and crystal structures.

With almost all of the metals that form silicides, at a siliciding reaction at a relatively low temperature, the heat of formation is small, and in contrast to the formation of a silicide phase having a small amount of silicon, at relatively high temperatures the heat of formation is large, this being replaced by a thermodynamically stable silicide phase having a large amount of silicon.

In the case of cobalt silicide, the participating phases are a CoSi crystal phase with a crystallization temperature of 450 to 500° C. and a $CoSi_2$ crystal phase with a crystallization temperature of 600° C. or higher, and in the thermal step of the phase change from the CoSi crystal phase to the $CoSi_2$ crystal phase, a spatially random lattice is formed, so that the final silicide thin film that is obtained is a polycrystal.

For this polycrystalline cobalt silicide, inevitable interface roughening causes increase of leakage current, worsening of thermal stability of the contact structure and increase of resistance.

Accordingly, it is an object of the present invention to improve on the above-described drawbacks in the prior art, by providing a semiconductor device wherein a ohmic contact is formed of cobalt silicide that has a high degree of surface flatness and a high uniformity, thereby enabling the achievement of a low resistance in the contact part, a low reactivity with other metals such as aluminum, and maintenance of good barrier characteristics and immunity to leakage currents, this semiconductor device featuring high-speed operation and high reliability, as well as the ability to be integrated to a high degree.

It is a further object of the present invention to provide a method for manufacturing the above-noted semiconductor device.

SUMMARY OF THE INVENTION

In order to achieve the above-noted objects, the present invention adopts the following basic technical constitution.

Specifically, the first aspect of the present invention is a semiconductor device that is provided with an ohmic contact made of a single-crystal $CoSi_2$ film on a silicon surface (100).

The second aspect of the present invention is a method for manufacturing a semiconductor device, this method having a step of performing hydrogen termination processing of a silicon (100) surface, a step of forming a cobalt film on the silicon surface (100) that was hydrogen termination processed, a step of causing thermal diffusion of the above-noted cobalt, so as to form an amorphous cobalt silicide film on the surface part of the silicon, this having an atomic number in Co:Si ratio of 1:1.5 to 1:2.5, and a step of performing heat treating of the above-noted amorphous cobalt silicide film so as to form an ohmic contact part that is made of a single-crystal $CoSi_2$ film.

A semiconductor device according to the present invention adopts the technical constitution described above, a feature of which is the provision of an ohmic contact part that is made of single-crystal $CoSi_2$ film on a silicon (100) surface, the effect being a flattening on a molecular level of the surface of this ohmic contact part and the achievement of a high uniformity, this enabling the achievement of a low-resistance contact part.

In addition, there is no reactivity with other metals such as aluminum, and maintenance of good barrier characteristics and immunity to leakage currents, giving this semiconductor device improved high-speed operation, high reliability, and the ability to be integrated to a high degree.

The provision of an ohmic contact made of a single-crystal CoSi$_2$ film on the silicon (100) surface is a new technology according to the present invention and, as discussed above, according to an invention by the inventor(s), with technology such as taught in Japanese Unexamined Patent Publication (KOKAI) No. 3-67334, Japanese Unexamined Patent Publication (KOKAL) No. 9-69497, Japanese Unexamined Patent Publication (KOKAI) No. 9-251967, and Japanese Unexamined Patent Publication (KOKAI) No. 10-45416, because the CoSi$_2$ film that forms the ohmic contact is a polycrystal, it is not possible to achieve the special effect of the present invention.

Furthermore, in the present invention the fact that the CoSi$_2$ film is a single-crystal film, in the usual meaning of the term, means that ideally the crystal orientation within the crystal is the same in all parts and that there are intrinsically no grain or other boundaries.

In actuality, however, if an electron beam is shone in the [100] direction using transmission electron beam diffraction, there is substantially a 99% or greater observation of diffraction spots on the CoSi$_2$ (100) surface that corresponds with the silicon (100) surface.

In the case of a polycrystal CoSi$_2$ film of the past, the ratio of the diffraction spots between the (100) surface and, for example, the normally observed (110) surface, is approximately 1:1, as could be calculated, for example, from the diffraction intensity.

From the electron beam diffraction image as well, it is possible to observe a polycrystal condition in which there are detectable crystal boundaries and boundary facets, for example, this enabling easy distinction of the single-crystal CoSi$_2$ film of the present invention from the polycrystal CoSi$_2$ film of the prior art.

In the present invention, the single-crystal CoSi$_2$ film that forms the ohmic contact is intrinsically formed only by a cobalt disilicide (CoSi$_2$) and intrinsically does not include other cobalt silicide phases such as cobalt silicide (CoSi) and dicobalt monosilicide (Co$_2$Si).

This single-crystal CoSi$_2$ film is preferably a single-crystal CoSi$_2$ film that is epitaxially joined to the silicon (100) surface, and the phrase "epitaxially joined to the silicon (100) surface" as used herein means that the crystal orientation between the CoSi$_2$ film and the silicon simultaneously satisfies the conditions CoSi$_2$ [100]//Si [100] and CoSi$_2$ [011]//Si [011].

Additionally, the ideal condition for this single-crystal CoSi$_2$ film or a single-crystal CoSi$_2$ film that is epitaxially joined to the silicon (100) surface is one in which the thickness of the single-crystal SiCo$_2$ film is 6 nm or less.

The reason for setting the upper limit of the thickness of the single-crystal SiCo$_2$ film to 6 nm is that this corresponds to the upper limit of film thickness of the pre-cursor, which is the amorphous cobalt silicide, based on thermodynamics or solid diffusion theory, and it is undesirable to exceed this thickness, since exceeding this thickness would result in undesirable crystallization in the amorphous cobalt silicide. While there is no particular lower limit to the thickness of the single-crystal CoSi$_2$ film, it is preferable in the current state of the art to make this 2 nm, in view of the need to form a uniform film.

In the present invention, after forming a single-crystal CoSi$_2$ film that is epitaxially joined to the silicon (100) surface and which has, for example, a film thickness in the range from 2 to 6 nm, it is possible preferable from a practical standpoint to laminate onto this a single-crystal CoSi$_2$ film or preferably a single-crystal CoSi$_2$ film that is expitaxially joined to the above-noted CoSi$_2$ film, this being provided as an element to form an ohmic contact.

Over the single-crystal CoSi$_2$ that forms the ohmic contact, it is possible to laminate a layer that is of an electrode or wire material such as aluminum or tungsten.

A feature of a semiconductor device according to the present invention is the formation of a cobalt film on a hydrogen termination processed silicon (100) surface, this cobalt being then heat treated so as to form on the surface part of the silicon an amorphous suicide layer, this having an atomic number ratio in Co:Si of 1:1.5 to 1:2.5, with further heat treating being done to form an ohmic contact part made of a single-crystal CoSi$_2$ film and preferably a (100) CoSi$_2$ film that is epitaxially joined to the silicon (100) surface.

That is, in the present invention, hydrogen termination processing is first done to the silicon (100) surface, using for example, a fluorine solution.

This achieves hydrogen termination of, for example, dangling bonds on the silicon (100) surface. In the case of an extremely thin cobalt film, for example having a thickness of from 0.7 to 2 nm, on the silicon (100) surface, this hydrogen termination is necessary in order to achieve a uniform and continuous film.

Next, as a pre-cursor to the single-crystal CoSi$_2$ film, instead of a cobalt silicide crystal phase such as CoSi as used in the past, an amorphous cobalt silicide layer having an atomic number ratio of 1.5 to 2.5 with respect to that of Co 1 is formed on the surface layer of the silicon.

This is based on the following knowledge of the inventors. Specifically, in general in a siliciding reaction with cobalt or the like, at the start of the reaction, at which point the treating temperature is sufficiently low, atoms of the metal cobalt, for example, diffuse into the silicon, thereby forming a mixed layer that is an amorphous silicide.

As the temperature is increased, when the phase transition temperature of the crystals near the mixture is exceeded, the crystallization of those crystal begins.

Because the composition and structure of the crystals that are formed reflect the composition of the amorphous silicide before crystallization, the silicide composition distribution after crystallization is determined by the composition distribution of the mixture layer.

In the case of cobalt silicide, to precipitate CoSi$_2$, it is desirable to approach Co:Si composition in the amorphous silicide of 1:2.

Therefore, the idea condition for the amorphous silicide as a pre-cursor is a composition of 1.5 to 2.5 silicon with respect to 1 cobalt.

If the amount of silicon is less than 1.5 or greater than 2.5 with respect to Co 1, the final CoSi$_2$ film that results is not a single crystal, and when observed with an electron microscope from the side, clearly loses its flatness, and it is possible to observe within the crystal steps, for example a (111) surface facet that is formed.

Upon further investigation and study based on the above-described conceptual idea, the inventors were able to arrive at the discovery that, by forming the above-described amorphous cobalt silicide as a pre-cursor, it is possible to achieve an unexpected film made of single-crystal CoSi$_2$ and also a single-crystal CoSi$_2$ that is epitaxially joined to the silicon (100) surface, this ultimately leading to present invention.

Therefore, it should be noted, the preferable ideal condition for forming a single-crystal CoSi$_2$ film or a single-crystal CoSi$_2$ that is epitaxially joined to the silicon (100) surface, in order to limit the amount of cobalt and make the amount of silicon large, is to have the cobalt film thickness be 2 nm or thinner, and also to have the thickness of the $CoSi_2$ film be 6 nm or thinner.

The reason for setting the upper limit of the cobalt film thickness to 2 nm and the upper limit to the $CoSi_2$ film thickness to 6 nm is that the upper limit of film thickness of the amorphous cobalt silicide, based on thermodynamics or solid diffusion theory, corresponds to the upper thickness limits of the cobalt film and $CoSi_2$ film, and if the cobalt film thickness exceeds 2 nm, there is a tendency toward undesirable crystallization in the amorphous cobalt silicide.

While there is no particular lower limit to the thickness of the cobalt film and the single-crystal $CoSi_2$ film, from the standpoint of forming a uniform film, it is usual in the current state of the art to make the lower limit of thickness of the cobalt film 0.7 nm and the lower limit of thickness of the single-crystal $CoSi_2$ film 2 nm.

In connection with the above, it is preferable in practicing the present invention to form, for example, a single-crystal (100) $CoSi_2$ film having a thickness in the range from 2 to 6 nm that is epitaxially joined to the silicon (100) surface, and then laminated onto this as an element to form an ohmic contact a single-crystal $CoSi_2$ film having an arbitrary thickness, this preferably being a single-crystal (100) $CoSi_2$ film that is epitaxially joined to the (100) $CoSi_2$ film.

Next, it is preferable to perform thermal diffusion of the cobalt while maintaining a temperature that is below the crystal phase transition temperature of cobalt silicide, this being the range from 300° C. to 450° C. The is because at a temperature below 300° C., the diffusion of cobalt requires an excessive amount of time, one hour or more being required for heat treating.

On the other hand, at a temperature that exceeds 450° C., before sufficient diffusion is reached, precipitation of cobalt silicide crystals other than $CoSi_2$, such as CoSi will begin.

The heat treating of the amorphous suicide is preferably performed at a temperature of 600° C. or greater, which is suitable for the generation of $CoSi_2$, this temperature range making it possible for an epitaxial relationship to be formed between the $CoSi_2$ and the silicon.

For example, if a uniform silicide film having a $CoSi_2$ (100)/Si(100) epitaxial boundary is first obtained, the structure is stable, after which this structure is maintained, even with heat treating at a temperature exceeding 800° C.

If an extremely uniform epitaxial film such as this is achieved, it is possible to suppress mutual diffusion with respect to electrodes and wiring made of, for example, aluminum on the ohmic contact part.

An experimental comparison of the physical properties obtained upon practicing the method of manufacturing a semiconductor device according to the present invention revealed the following results.

Specifically, a Si (100) substrate was treated with BHF (buffered hydrofluoric acid), thereby removing the natural oxide film from the surface and performing hydrogen termination of the surface.

Next, the substrate was transported into a high vacuum, where an electron beam gun was used to deposit cobalt to a thickness of 1 nm, while maintaining the chamber temperature.

Then, the substrate temperature is maintained at 400° C. for ten minutes, after which it is slowed raised (at a rate of 20° C./minute) until it reaches 700° C., immediately after which the temperature is dropped.

If the structure of this Si (100) surface is observed using reflection high-energy electron diffraction (RHEED), a spot diffraction pattern corresponding to polycrystal cobalt after deposition of the cobalt appears, and at heat treating at 400° C., there is a gradual change to a hollow pattern that corresponds to amorphous cobalt silicide.

If the temperature is further increased to 700° C., the pattern changes to a streak pattern that indicates epitaxial silicide which completely reflects the substrate orientation.

If the cross-section of the film thus obtained is observed using a high-resolution transmission electron microscope (TEM), it is possible to observe the alignment of the silicon crystal lattice of the substrate, as well as a $CoSi_2$ crystal layer that is arranged in the (100) direction.

The boundary is flat to within a level of 1 or 2 atoms, and the film thickness is nearly uniform at approximately 3 nm.

In contrast to the above results, in the case in which a cobalt film having a thickness of 2 nm is heat treated with a final temperature of 600° C. without performing hydrogen termination, electron diffraction of the CoSi film that is formed revealed a polycrystal condition having a diffraction intensity ratio between diffraction lines in the (100) and (110) directions of 60:40, this film being not continuous but rather exhibiting a separated island shape.

If, for example, a hydrochloric acid Branson cleaning solution is used as the final cleaning solution instead of the original BHF, a thin natural oxide film will remain on the surface, the final thickness of the film that is formed being non-uniform and not an epitaxial film.

That is, in a method for manufacturing a semiconductor device according to the present invention, it is necessary to go through the processes of hydrogen termination and the formation of an amorphous cobalt silicide phase having a specific composition, and if either of these conditions is not satisfied, it is not possible to achieve a cobalt silicide, that is, a single-crystal $CoSi_2$ film and preferably a single-crystal (100) $CoSi_2$ film that is epitaxially joined to the silicon (100) surface which is suitable for the formation of an ohmic contact.

DESCRIPTION OF THE PREFERRED EMBODIMENTS

Embodiments of a semiconductor device and a method for manufacturing a semiconductor device according to the present invention are described below in detail, with references being made to relevant accompanying drawings.

Figure 1:
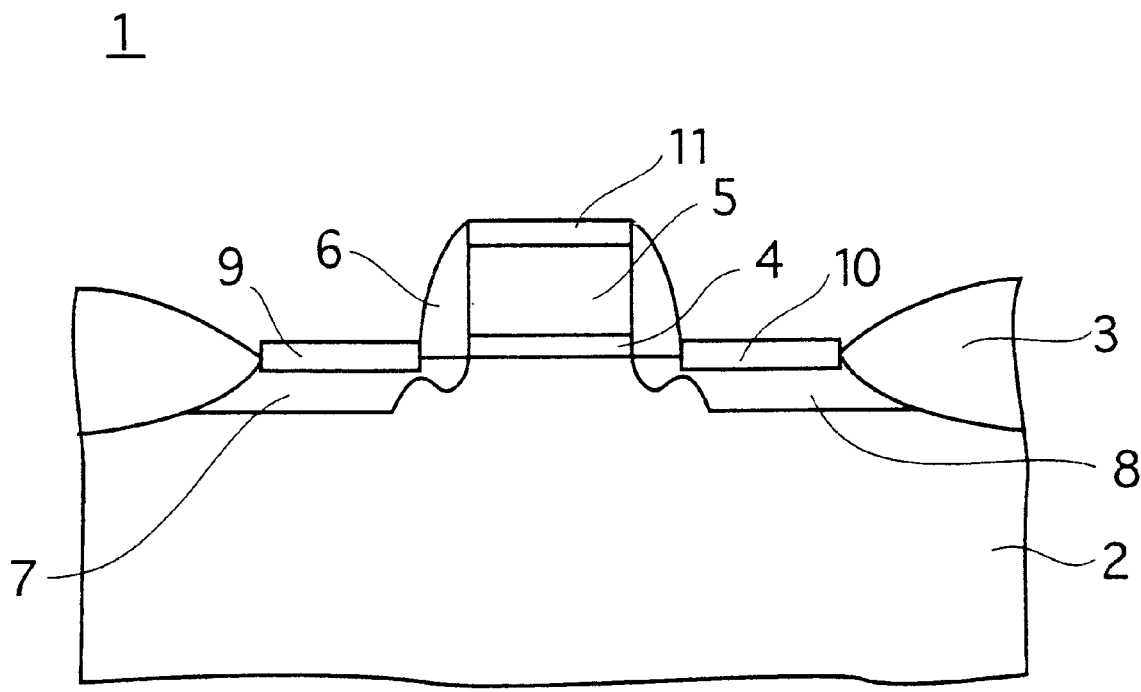
FIG. 1 is a cross-section view that shows an example of the specific structure of an embodiment of a semiconductor device according to the present invention.

Specifically, FIG. 1 is a set of cross-section views that an embodiment of a semiconductor device that includes a MOS transistor element region that is formed on a silicon substrate, in which the surface is the (100) surface, this drawing showing a semiconductor device in which source and drain regions 7 and 8 are formed on the surface part of a silicon semiconductor substrate 2, with ohmic contact parts 9 and 10 being provided on these source and drain regions 7 and 8.

In this drawing, the reference numeral 3 denotes an element separation film that delineates the MOS transistor element region, 4 is a gate insulation film, 5 is a n-type or p-type polysilicon layer, 6 is a side wall insulation film that is formed on the side edge part of the polysilicon layer, 11 is an ohmic contact part which serves as an electrical contact for the polysilicon layer 5, which can be made from a $CoSi_2$ film that is formed simultaneously by siliciding along with the ohmic contact parts 9 and 10.

Next, an embodiment of a method for manufacturing a semiconductor device according to the present invention will be described in detail.

FIG. 2(a) through FIG. 2(d) are cross-section views that illustrate the process steps for manufacturing a semiconductor device that includes a MOS transistor element region such as shown in FIG. 1, in which a $CoSi_2$ film is formed as an ohmic contact on a source region and/or a drain region formed on the surface part of the silicon substrate within the MOS transistor element region.

Figure 2:
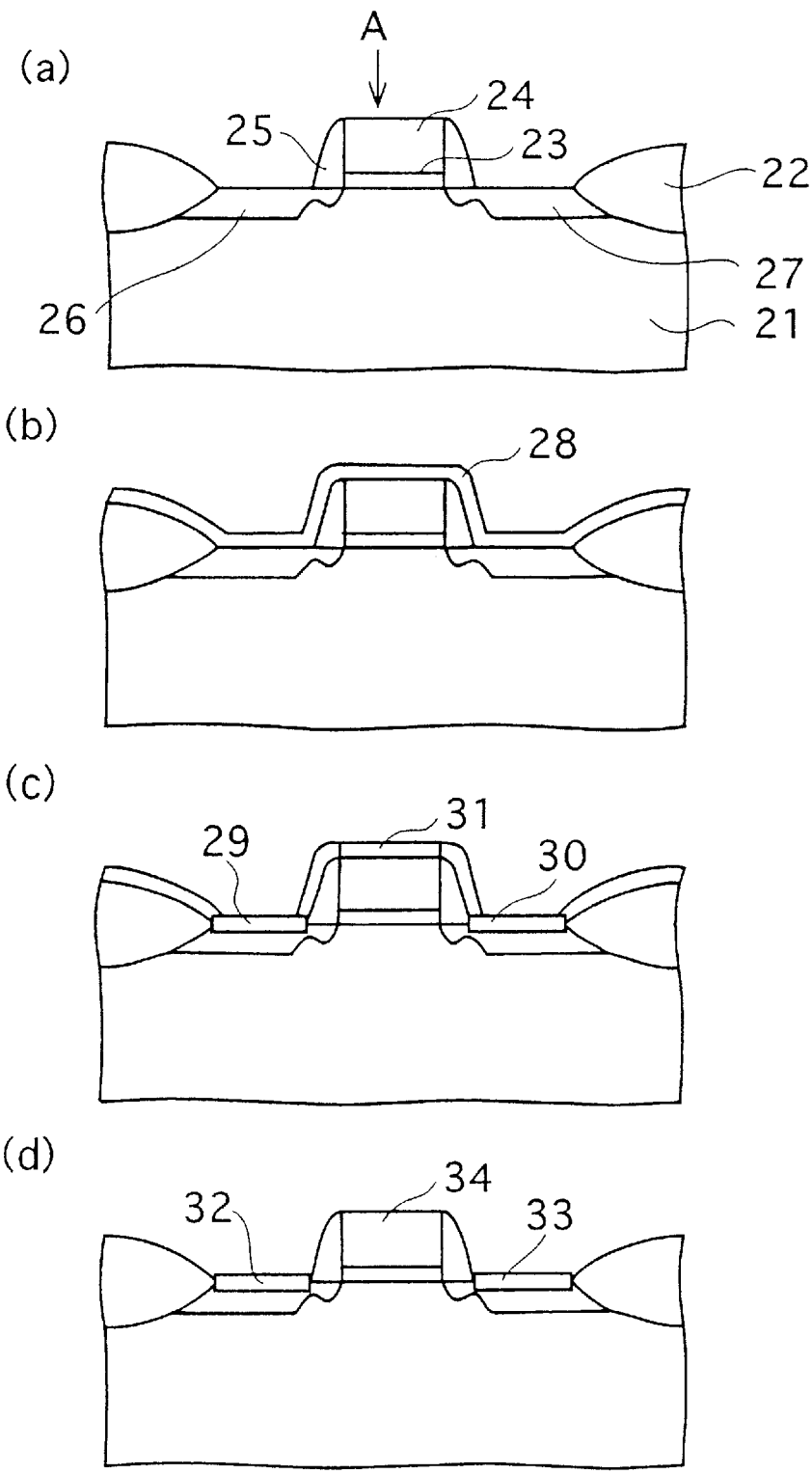
FIG. 2 is a set of cross-section views that illustrate an embodiment of the method for manufacturing a semiconductor device according to the present invention, FIG. 2(a) showing the condition in which a gate A is formed, FIG. 2(b) showing the condition in which a cobalt film 28 is formed, FIG. 2(c) showing the condition in which amorphous cobalt silicide films 29, 30, and 31 are formed, and FIG. 2(d) showing the condition in which a $CoSi_2$ film is formed.

First, as shown in FIG. 2(a), an element separation region silicon oxide film 22 is formed on the semiconductor substrate 21, after which a gate oxide film 23 is formed on the surface part of the of the semiconductor substrate 21.

Then, after forming a polysilicon film 24 on the gate oxide film 23, patterning is done so as to form a gate A.

Then, a source region 26 and a drain region 27 are delineated by low-concentration ion implantation, after which an insulation film is deposited and anisotropic etching is done so as to form a side wall insulation film 25.

Then, a high dose of dopant is ion-implanted into the polysilicon film 24, the source region 26, and the drain region 27, and heat treating is performed to activate the dopant, thereby making the polysilicon film 24 either n-type or p-type, and completing the source region 26 and drain region 27 as LDD-structured dopant diffusion layers.

Next, buffered hydrofluoric acid (BHF solution) is used to remove the natural oxide film on the surface part of the silicon semiconductor substrate onto which have been formed the source region and/or the drain region 27, this also simultaneously performing hydrogen termination of the surface of the semiconductor substrate, after which the semiconductor substrate is placed into a sputtering apparatus, in which a cobalt film 28 having a thickness of 2 nm, for example, is formed over the entire surface thereof.

Next, without disturbing the vacuum condition in the sputtering apparatus, the temperature is raised to 400° C., this temperature being maintained for 10 minutes so as to completely consume the cobalt so that, as shown in FIG. 2(c), onto the source region 26 and/or drain region 27, amorphous cobalt silicide films 29 and 30 are formed, to a thickness, for example, of 6 nm.

Then the temperature is gradually raised at a rate of 50° C./minute to 700° C., this temperature being maintained for 5 minutes, after which the temperature is dropped.

The cobalt silicide film obtained in this manner has, for example, a film thickness of 6 nm, and is a $CoSi_2$ film that forms a $CoSi_2(100)/Si(100)$ epitaxial boundary that reflects the crystal orientation of the substrate.

If the $CoSi_2$ film of thickness 6 nm formed in the above-described manner does not have sufficient thickness for the formation, for example, of via holes, sputtering or the like is used to deposit cobalt onto the $CoSi_2$ film to a thickness of 6 nm, an immediate transition being made to ramped heating and rapid heat treating for 120 seconds at 750° C. in an argon atmosphere, thereby yielding a $CoSi_2$ film having a thickness of 20 nm.

While the boundary has a non-uniformity of 2 to 3 nm, this is an epitaxial film that has a crystal orientation that is the same as the original epitaxial film. That is, with the second film growth, because the solid phase reaction proceeds with the first grown $CoSi_2$ film as the seed, it is easy to achieve an overall epitaxial film.

Next, in order to remove the non-reacted cobalt of the cobalt thin film 28, a mixed acid of, for example, sulfuric acid, phosphoric acid, and acetic acid in the ratio of 1:1:4:4 is used to perform etching at 50° C., the result being the self-aligned formation of ohmic contact parts 32, 33, and 34 as shown in FIG. 2(d).

To evaluate the electrical characteristics of the ohmic contact parts 32 and 33 formed in the above-noted manner, aluminum wires were formed on a large number of ohmic contact parts formed using the same method, forming a contact chain pattern with 2000 ohmic contacts that measure 1 $\mu\Omega$m by 1 $\mu\Omega$m. The result was an average contact resistance of $4\times10^{-8}$ $\mu\Omega\text{-cm}^2$ on an n-type substrate and an average resistance of $1\times10^{-7}$ $\mu\Omega\text{-cm}^2$ on a p-type substrate, these resistances being sufficiently low.

After performing heat treating for 30 minutes at 500° C. in a hydrogen atmosphere, electrical characteristics were measured, the result being that there was almost no rise in resistance and that the immunity to leakage current was sufficient as well.

In this case, regardless of the relatively thick, 20 nm, $CoSi_2$ film, the fact that the electrical characteristics exhibited stability with respect to heat treating indicated the high degree of crystallization of the $CoSi_2$ film.

Figure 3:
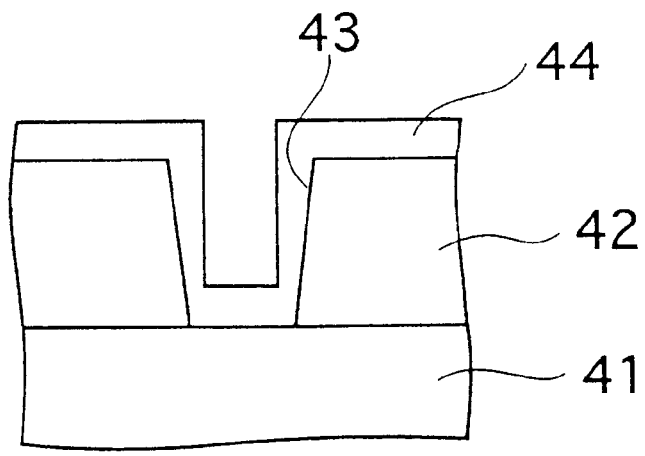
FIG. 3 is a set of cross-section views that illustrate an embodiment of the method for manufacturing a semiconductor device according to the present invention, FIG. 3(a) showing the condition in which a cobalt film 44 is formed, for example, on the bottom part of a contact hole 43, FIG. 3(b) showing the condition in which a $CoSi_2$ film is formed, and FIG. 3(c) showing the condition in which an aluminum wire 46 is formed.
Figure 3:
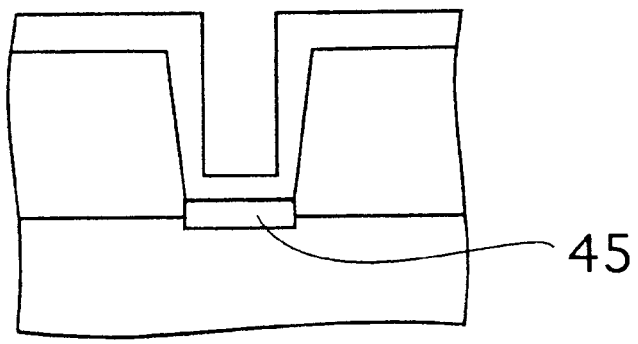
Figure 3:
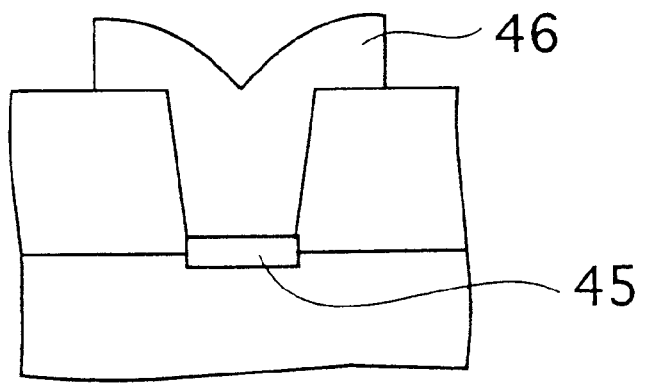

Next, another embodiment of a method of manufacturing a semiconductor device according to the present invention, will be described, as illustrated in FIG. 3, which shows the case in which an ohmic contact is formed within a contact hole that is formed in the interlayer insulation film on a Si (100) substrate.

In this case, as shown in FIG. 3(a), after forming a silicon oxide film 42 having a thickness of 300 nm so as to cover the surface of both the n-type and p-type Si (100) substrate 41 that has a resistivity of 10 $\mu\Omega$-cm, a contact hole 43 is made with a diameter of 100 $\mu$m, and then thermal oxidation is performed to form a silicon thermal oxide film having a thickness of 20 nm, for the purpose of removing process damage, on the surface of the semiconductor substrate 41 exposed at the bottom part of the contact hole 43, after which treatment is done with diluted hydrofluoric acid so as to completely remove the oxide film at the bottom part of the contact hole 43.

Next, The semiconductor substrate 41 is placed into a vacuum chamber and the temperature thereof is maintained at 50° C., an electron beam being used to form a metal cobalt thin film 44 having a film thickness of 2 nm inside the contact hole 43 and over the entire top of the silicon oxide film 42, as shown in FIG. 3(b).

Then, the temperature in the vacuum chamber is held at 400° C. for 10 minutes, after which it is raised to 700° C. at which heat treating is performed so that, as shown in FIG. 3(b), an epitaxial single-crystal film 45 of $CoSi_2$ is formed in the bottom of the contact hole 43.

After the above operations are performed, the cobalt film 44 is removed by using an acid bath, after which an aluminum film having a thickness of 200 nm is formed on the above-noted epitaxial $CoSi_2$ single-crystal film 45, within the contact hole 43, and around the periphery of the aperture thereof, patterning being then done so as to form the contact pad 46, as shown in FIG. 3(c).

The ohmic contact 45 that is obtained in the manner described above forms a Schottky junction diode the barrier height of which can be measured by using the I–V method. With respect to n-type and p-type samples, the typical barrier heights that were measured at a temperature of 77K were 0.65 eV and 0.45 eV, respectively.

Because the sum of these two is close to the band gap 1.1 eV of silicon, this demonstrates that distribution of barrier height within the contact is nearly uniform.

By adopting the technical constitution described in detail above, a semiconductor device and method for manufacturing a semiconductor device according to the present invention provides an ohmic contact part made from a single-crystal $CoSi_2$ film on a silicon (100) surface, and in doing so achieve an ohmic contact that exhibits surface flatness on the atomic level and that has improved uniformity of thickness and other properties.

The result of this is not only the achievement of a low resistance in this contact part, but also a small reactivity with metals such as aluminum, a high barrier, and the maintenance of immunity to leakage currents.

For example, even if a junction depth is made 50 nm or shallower in order to improve the speed of a semiconductor device, there is no local disturbance of the structure at the junction boundary when siliciding is done, it is difficult for leakage currents to occur, and the structure is uniform.

The effect of these properties is that there is a suppression of variations in contact characteristics between devices, and it is possible to improve both the reliability and the degree of integration of semiconductor devices making use of the present invention.

What is claimed is:

1. A method for manufacturing a semiconductor device comprising the steps of:

forming a cobalt film on a silicon surface (100);

causing thermal diffusion of said cobalt, so as to form an amorphous cobalt suicide film on a surface part of said silicon, this having a pre-crystallization atomic numbers Co:Si ratio of 1:1.5 to 1:2.5; and performing heat treating of said amorphous cobalt suicide film so as to form an ohmic contact part that is made of a single-crystal $CoSi_2$ film.

2. A method for manufacturing a semiconductor device according to claim 1, and including the step of performing hydrogen termination processing of said silicon surface before forming said cobalt film.

3. A method for manufacturing a semiconductor device according to claim 1, wherein said thermal diffusion of said cobalt is performed at a temperature in the range from 300° C. to 450° C.

4. A method for manufacturing a semiconductor device according to claim 2, wherein said thermal diffusion of said cobalt is performed at a temperature in the range from 300° C. to 450° C.

5. A method for manufacturing a semiconductor device according to claim 1, wherein said heat treating of said amorphous cobalt silicide is performed at a temperature of 600° C. or higher.

6. A method for manufacturing a semiconductor device according to claim 1, wherein said single-crystal $CoSi_2$ film is a single-crystal $CoSi_2$ film that is epitaxially joined to said silicon (100) surface.

7. A method for manufacturing a semiconductor device according to claim 6, wherein the thickness of said cobalt film is in the range from 0.7 nanometer to 2 nanometers, and further wherein the thickness of said epitaxial single-crystal $CoSi_2$ film is in the range from 2 to 6 nanometers.

8. A method for manufacturing a semiconductor device according to claim 7, wherein in addition to said epitaxial single-crystal $CoSi_2$ film having a thickness in the range from 2 to 6 nanometers, an epitaxial single-crystal $CoSi_2$ film is laminated onto said epitaxial single-crystal $CoSi_2$ film having a thickness in the range from 2 to 6 nanometers as an element for forming an ohmic contact part.

9. A method for manufacturing a semiconductor device according to claim 8, wherein said single-crystal $CoSi_2$ film that is laminated onto said epitaxial single-crystal $CoSi_2$ film having a thickness in the range from 2 to 6 nanometers is a single-crystal $CoSi_2$ film that is epitaxially joined to said epitaxial single-crystal $CoSi_2$ film having a thickness in the range from 2 to 6 nanometers.

10. A method for manufacturing a semiconductor device according to claim 1, wherein said semiconductor device including a MOS transistor element region on a said silicon substrate, and further wherein said ohmic contact part is provided on at least one of a source region and a drain region provided on a surface layer part of said silicon substrate in said MOS transistor element region.

11. A method for manufacturing a semiconductor device according to claim 2, wherein said hydrogen termination processing is performed by using a hydrofluoric acid solution.

* * * * *

UNITED STATES PATENT AND TRADEMARK OFFICE
CERTIFICATE OF CORRECTION

PATENT NO. : 6,559,041 B2
DATED : May 6, 2003
INVENTOR(S) : Miura

It is certified that error appears in the above-identified patent and that said Letters Patent is hereby corrected as shown below:

<u>Column 9,</u>
Line 51, "suicide" should be -- silicide --.

<u>Column 10,</u>
Line 1, "suicide" should be -- silicide --.

Signed and Sealed this

Twentieth Day of July, 2004

JON W. DUDAS
*Acting Director of the United States Patent and Trademark Office*